United States Patent [19]
Lee et al.

[11] Patent Number: 6,124,407
[45] Date of Patent: Sep. 26, 2000

[54] SILICONE COMPOSITION, METHOD FOR THE PREPARATION THEREOF, AND SILICONE ELASTOMER

[75] Inventors: Yeong Joo Lee, Midland; Michael Dean Livingston, Saginaw; Hongxi Zhang; Randall Gene Schmidt, both of Midland, all of Mich.

[73] Assignee: Dow Corning Corporation, Midland, Mich.

[21] Appl. No.: 09/181,211

[22] Filed: Oct. 28, 1998

[51] Int. Cl.$^7$ .......................... C08G 77/04; C08G 77/12; C08G 77/20

[52] U.S. Cl. .......................... 525/478; 525/476; 524/404; 524/430; 524/428; 524/588; 524/267; 524/730

[58] Field of Search ...................................... 525/478, 476; 524/404, 430, 428, 588, 267, 730

[56] References Cited

U.S. PATENT DOCUMENTS

| | | |
|---|---|---|
| 4,082,726 | 4/1978 | Mine et al. . |
| 4,293,671 | 10/1981 | Sasaki et al. ............................. 528/31 |
| 5,216,104 | 6/1993 | Okami et al. . |
| 5,373,078 | 12/1994 | Juen et al. . |
| 5,756,598 | 5/1998 | Chung et al. . |
| 5,977,226 | 11/1999 | Dent et al. ............................... 524/267 |

FOREIGN PATENT DOCUMENTS 0 767 216   4/1997   European Pat. Off. .

*Primary Examiner*—Robert Dawson
*Assistant Examiner*—Jeffrey B. Robertson
*Attorney, Agent, or Firm*—Larry A. Milco

[57] ABSTRACT

A silicone composition comprising (A) 100 parts by weight of a polydiorganosiloxane containing an average of at least two silicon-bonded alkenyl groups per molecule; (B) 75 to 150 parts by weight of an organopolysiloxane resin having a number-average molecular weight of from 2,000 to 5,000 and consisting essentially of $R^3_2R^4 SiO_{1/2}$ units and $SiO_{4/2}$ units wherein each $R^3$ is independently selected from the group consisting of monovalent hydrocarbon and monovalent halogenated hydrocarbon groups free of aliphatic unsaturation, $R^4$ is selected from the group consisting of $R^3$ and alkenyl, the mole ratio of $R^3_2R^4 SiO_{1/2}$ units to $SiO_{4/2}$ units is from 0.6:1 to 1.1:1, and the resin contains an average of from 2.5 to 7.5 mole percent of alkenyl groups; (C) an organohydrogenpolysiloxane having an average of at least three silicon-bonded hydrogen atoms per molecule in an amount sufficient to provide from one to three silicon-bonded hydrogen atoms per alkenyl group in components (A) and (B) combined; (D) an adhesion promoter in an amount sufficient to effect adhesion of the composition to a substrate; and (E) a hydrosilylation catalyst in an amount sufficient to cure the composition.

29 Claims, No Drawings

SILICONE COMPOSITION, METHOD FOR THE PREPARATION THEREOF, AND SILICONE ELASTOMER

FIELD OF THE INVENTION

The present invention relates to a silicone composition and more particularly to an addition-curable silicone composition containing a critical concentration of an organopolysiloxane resin having a defined molecular weight. This invention also relates to a method for the preparation of this composition and to a silicone elastomer produced therefrom.

BACKGROUND OF THE INVENTION

Silicones are widely employed in the electrical and electronics industries due to their unique properties, which include low alpha particle emissions, very good moisture resistance, excellent electrical insulation, excellent thermal stability, and very high ionic purity. In particular, silicone encapsulants are used to improve the reliability of electronic devices by providing protection against environmental moisture, UV radiation, ozone, and weathering. Moreover, recent advances in semiconductor packaging, namely, the development of chip scale or chip size packages, have created a critical demand for high performance silicone encapsulants.

Curable silicone compositions comprising a polydimethylsiloxane polymer and an organopolysiloxane resin are well known in the art. These compositions typically employ up to about 50 parts by weight of resin per 100 parts by weight of polymer. Furthermore, several cure systems are recognized, including hydrosilylation, peroxide, moisture, condensation, and radiation.

However, silicone elastomers produced from such compositions typically exhibit several fold increases in coefficient of thermal expansion and modulus in the temperature range corresponding to the amorphous-crystalline phase transition, typically from −50 to 40° C., rendering them unsuitable for use as encapsulants in chip scale packages at very low temperatures. As the amorphous-crystalline transition is traversed during thermal cycling, stresses develop in the chip scale package due to thermal expansion and contraction of the silicone encapsulant and the difference in coefficients of thermal expansion between the substrate and silicon die. Thermally-induced stresses can damage critical components of a semiconductor package, including solder joints and lead wires, resulting in poor reliability.

Inorganic fillers such as silica and alumina are typically added to silicone compositions to reduce the coefficient of thermal expansion of cured products. Such fillers have very low coefficients of thermal expansion compared to a silicone elastomer and thus produce an overall reduction in thermal expansion of the elastomer. However, fillers also increase the viscosity of a silicone composition and, consequently, often reduce processability.

Various approaches to controlling the moduli of silicone compositions have been reported in the literature. For example, nonfunctional silicone oils have been employed to regulate the moduli of elastomers produced from curable silicone compositions. Unfortunately, silicone oils have a tendency to undergo post cure migration, causing shrinkage of the composition and contamination of surrounding materials.

Reactive silicone oils have also been used in silicone compositions to lower the modulus of a cured silicone rubber. For example, U.S. Pat. No. 5,216,104 to Okami et al. discloses an addition-type curable silicone rubber composition comprising (A) an organopolysiloxane containing at least two alkenyl groups per molecule, (B) an organopolysiloxane containing an average of one alkenyl group per molecule, (C) an organohydrogenpolysiloxane containing at least two silicon-bonded hydrogen atoms per molecule, (D) a platinum catalyst, and optionally an organopolysiloxane resin. The '104 patent teaches that the silicone rubber composition can give a low modulus silicone rubber by curing which neither contaminates the material in contact therewith nor deforms owing to shrinkage, without hindering the adhesion of the composition during its curing stage. Unlike the '104 patent, the present invention does not require an organopolysiloxane containing an average of one alkenyl group per molecule. Also, the '104 patent does not teach the molecular weight limitations on the organopolysiloxane resin, resin to polymer ratio, and adhesion promoter of the present invention.

Organopolysiloxane resins have also been used in silicone compositions to regulate the moduli of cured materials. For example, U.S. Pat. No. 5,705,587 to Hatanaka et al. teaches a room temperature-curable silicone elastomer composition comprising (A) a diorganopolysiloxane composed of (a) a silanol-enblocked diorganopolysiloxane and (b) a diorganopolysiloxane that is endblocked at one molecular chain terminal by silanol and at the other terminal by trialkylsiloxy; (B) an alkoxy functional silane; (C) an organopolysiloxane resin; (D) a curing catalyst; and (E) a diorganopolysiloxane containing at least two carboxyl groups. The '587 patent also teaches that the aforementioned composition has an excellent pre-cure workability and cures into a low-modulus, high-elongation silicone elastomer. However, the '587 patent does not teach the polydiorganosiloxane polymer, organopolysiloxane resin, resin to polymer ratio, organohydrogenpolysiloxane, and hydrosilylation catalyst of the present invention.

U.S. Pat. No. 5,373,078 to Juen et al. discloses curable organosiloxane compositions comprising a liquid polyorganosiloxane having an average of at least two alkenyl groups per molecule, (B) a liquid organohydrogenpolysiloxane having at least three silicon-bonded hydrogen atoms per molecule, (C) a hydrosilylation catalyst, and (D) a liquid MQ organosiloxane resin. The '078 patent also teaches that the liquid MQ resin reduces the viscosity of the curable compositions and the moduli of cured elastomers prepared from the compositions without any substantial adverse affect on the physical properties of the cured elastomers. However, the '078 patent does not teach the organopolysiloxane resin, resin to polymer ratio, and adhesion promoter of the present invention.

EP 0767216 to Schmidt discloses moisture-cure and addition-cure silicone resin/fluid alloy compositions that exhibit high strength and toughness over a predetermined service temperature range comprising (A) an organosilicone resin, (B) a predominately linear silicone fluid, and (C) a predetermined quantity of a crosslinker having at least three functional groups per molecule. The EP 0767216 patent teaches that the crosslinked product of (A) and (B), when free of an inorganic filler, exhibit a shear loss modulus (G") greater than or equal to $10^6$ Pa and a loss tangent greater than or equal to 0.10. However, the EP0767216 application further discloses that such compositions have utility in the manufacture of molded and extruded articles and, therefore, does not teach the adhesion promoter of the present invention.

U.S. Pat. No. 5,756,598 to Chung et al. discloses an organosiloxane composition curable to a silicone elastomer comprising (A) a polydiorganosiloxane having an average of at least two silicon-bonded alkenyl groups per molecule; (B) an organohydrogensiloxane having an average of at least two silicon-bonded hydrogen atoms per molecule; (C) a platinum group catalyst, and (D) a resinous organosiloxane copolymer having an average of at least two alkenyl groups per molecule. The '598 patent also teaches that the aforementioned composition is curable to a silicone elastomer having improved weep properties. However, the '598 patent does not teach the resin to polymer ratio of the present invention.

The present inventors have discovered that a silicone composition comprising a critical concentration of an organopolysiloxane resin having a number-average molecular weight within a specified range cures to form an elastomer having excellent adhesion to a variety of substrates and a very low coefficient of thermal expansion and storage modulus over a wide temperature range.

SUMMARY OF THE INVENTION

The present invention is directed to a silicone composition comprising:

(A) 100 parts by weight of a polydiorganosiloxane containing an average of at least two silicon-bonded alkenyl groups per molecule;

(B) 75 to 150 parts by weight of an organopolysiloxane resin having a number-average molecular weight of from 2,000 to 5,000 and consisting essentially of $R^3_2R^4 SiO_{1/2}$ siloxane units and $SiO_{4/2}$ siloxane units wherein each $R^3$ is independently selected from the group consisting of monovalent hydrocarbon and monovalent halogenated hydrocarbon groups free of aliphatic unsaturation, $R^4$ is selected from the group consisting of $R^3$ and alkenyl groups, the mole ratio of $R^3_2R^4 SiO_{1/2}$ units to $SiO_{4/2}$ units is from 0.6:1 to 1.1:1, and the resin contains an average of from 2.5 to 7.5 mole percent of alkenyl groups;

(C) an organohydrogenpolysiloxane having an average of at least three silicon-bonded hydrogen atoms per molecule in an amount sufficient to provide from one to three silicon-bonded hydrogen atoms per alkenyl group in components (A) and (B) combined;

(D) an adhesion promoter in an amount sufficient to effect adhesion of the composition to a substrate; and (E) a hydrosilylation catalyst in an amount sufficient to cure the composition.

The present invention is also directed to a silicone elastomer comprising a reaction product of the composition described above.

The present invention is further directed to a multi-part silicone composition comprising components (A) through (E) specified above, with the proviso that neither the polydiorganosiloxane nor the organopolysiloxane resin are present with the organohydrogenpolysiloxane and the hydrosilylation catalyst in the same part.

The instant invention is further directed to a method of preparing a silicone composition, comprising the steps of mixing components (A) through (E) delineated above.

The invention is still further directed to a chip scale package comprising a semiconductor chip, a supporting substrate, at least one member that connects the semiconductor chip to the substrate, and the silicone composition described above.

The silicone composition of the present invention possesses the rheological properties required for a number of applications. For example the composition of the instant invention exhibits rapid flow around and/or under a silicon chip or die and is particularly suitable for use in high throughput encapsulation processes. In particular, the viscosity of the composition is sufficiently low to ensure rapid and complete filling of the semiconductor device and to allow escape of entrapped air bubbles. It is not necessary to dilute the composition of the present invention with an organic solvent to achieve a workable viscosity. Consequently, the present solventless composition avoids the health and environmental hazards associated with solvent-borne silicones. Furthermore, during curing, the solventless composition typically undergoes less shrinkage than solvent-borne silicone compositions.

The cured silicone composition of the present invention also displays excellent adhesion to a wide variety of materials, including those commonly employed in chip scale packages, such as metals, glass, silicon, silicon dioxide, ceramics, rubbers, and plastics. In particular, the cured composition has excellent adhesion to flexible support materials used in chip scale packages, particularly polyimide tape.

Moreover, the silicone composition of the present invention cures to form an elastomer having excellent thermal stability and flexibility in the temperature range from −65 to 150° C. as evidenced by low thermal expansion and low modulus. In particular, the cured composition of the present invention has a coefficient of thermal expansion typically less than 300 $\mu$m/m° C. in the temperature range from −50 to −40° C. Also, the ratio of the storage modulus at −65° C. to the storage modulus at 20° C. is typically less than 5. As a consequence of low thermal expansion and low modulus, the elastomer of the instant invention exhibits minimal dimensional change and excellent flexibility at low temperatures. The flexible silicone elastomer relieves thermally induced stress on delicate leads and solder connections in a semiconductor package due to a difference in the coefficients of thermal expansion between the silicon die and substrate.

Additionally, the present silicone composition has high radiological purity (low alpha particle emissions) required for RAM applications; low levels of ionic impurities (e.g., sodium, potassium, chloride); and excellent electrical properties, such as a low dielectric constant and dissipation factor. The composition of the present invention is particularly useful as an encapsulant in chip scale or chip size semiconductor packages.

These and other features, aspects, and advantages of the present invention will become better understood with reference to the following description and appended claims.

DETAILED DESCRIPTION OF THE INVENTION

Component (A) of the present invention is a polydiorganosiloxane containing an average of at least two silicon-bonded alkenyl groups per molecule. Suitable alkenyl groups contain from 2 to about 6 carbon atoms and are exemplified by, but not limited to vinyl, allyl, and hexenyl. The alkenyl groups in component (A) may be located at terminal, pendant, or both terminal and pendant positions. The remaining silicon-bonded organic groups in component (A) are independently selected from the group consisting of monovalent hydrocarbon and monovalent halogenated hydrocarbon groups free of aliphatic unsaturation. These groups typically contain from 1 to about 8 carbon atoms, preferably from 1 to 4 carbon atoms, and are exemplified by, but not limited to alkyl such as methyl, ethyl, propyl, and butyl; aryl such as phenyl; and halogenated alkyl such as 3,3,3-trifluoropropyl. Typically, at least 50 percent of the organic groups in component (A) are methyl.

The structure of component (A) is typically linear, however it may contain some branching due to the presence of trifunctional siloxane units. The viscosity of component (A) at 25° C., which varies with molecular weight and structure, is typically from 0.5 to 100 Pa.s, preferably from 1 to 50 Pa.s, and more preferably from 2 to 30 Pa.s.

Preferably, component (A) is a polydiorganosiloxane having the general formula $R^2R^1{}_2SiO(R^1{}_2SiO)_nSiR^1{}_2R^2$ wherein each $R^1$ is independently selected from the group consisting of monovalent hydrocarbon and monovalent halogenated hydrocarbon groups free of aliphatic unsaturation, as defined above; $R^2$ is alkenyl, as defined above; and n has a value such that the viscosity of component (A) at 25° C. is in one of the ranges cited above. Preferably, $R^1$ is methyl and $R^2$ is vinyl.

Component (A) can comprise a single polydiorganosiloxane or a mixture of two or more polydiorganosiloxanes having different viscosities. For example, component (A) can comprise a mixture of a first polydiorganosiloxane having a viscosity of from 40 to 100 Pa.s at 25° C. and a second polydiorganosiloxane having a viscosity of from 1 to 10 Pa.s at 25° C. In a preferred embodiment, component (A) comprises a first polydiorganosiloxane having a viscosity of from 45 to 65 Pa.s at 25° C., and 10 to 50 percent, preferably 25 to 35 percent by weight, of a polydiorganosiloxane having a viscosity of from 1.8 to 2.4 Pa.s at 25° C. In this embodiment, the lower viscosity polydiorganosiloxane improves both the flow of the liquid composition and the solvent resistance of the cured silicone product.

Specific examples of polydiorganosiloxanes useful in the present invention include, but are not limited to, the following: $ViMe_2SiO(Me_2SiO)_nSiMe_2Vi$, $ViMe_2SiO(Me_2SiO)_{0.92n}(MePhSiO)_{0.08n}SiMe_2Vi$, $ViMe_2SiO(Me_2SiO)_{0.98n}(MeViSiO)_{0.02n}SiMe_2Vi$, $ViMePhSiO(Me_2SiO)_{0.92n}(MePhSiO)_{0.08n}SiMePhVi$, $Me_3SiO(Me_2SiO)_{0.95n}(MeViSiO)_{0.05n}SiMe_3$, $PhMeViSiO(Me_2SiO)_nSiPhMeVi$, and others, where Me, Vi, and Ph denote methyl, vinyl, and phenyl respectively and n is as defined above. Preferred polydiorganosiloxanes are dimethylvinylsiloxy-terminated polydimethylsiloxanes.

Methods for preparing component (A) of the present composition, such as condensation of the corresponding halosilanes or equilibration of cyclic polydiorganosiloxanes, are well known in the art.

Component (B) of the present invention is an organopolysiloxane resin consisting essentially of $R^3{}_2R^4SiO_{1/2}$ siloxane units and $SiO_{4/2}$ siloxane units wherein each $R^3$ is independently selected from the group consisting of monovalent hydrocarbon and monovalent halogenated hydrocarbon groups free of aliphatic unsaturation, and $R^4$ is selected from the group consisting of $R^3$ and alkenyl. The monovalent hydrocarbon and monovalent halogenated hydrocarbon groups free of aliphatic unsaturation and alkenyl groups in component (B) are identical to those defined above for component (A). Typically at least 50 percent, and preferably all of the $R^3$ groups are methyl. The preferred alkenyl group for $R^4$ is vinyl.

The mole ratio of $R^3{}_2R^4SiO_{1/2}$ units to $SiO_{4/2}$ units is from 0.6 to 1.1, and preferably from 0.9 to 1.1, as determined by $^{29}Si$ nuclear magnetic resonance ($^{29}SiNMR$) spectrometry. The M/Q ratio represents the total number of M units to the total number of Q units in component (B) and includes contributions from any neopentamer present, described below.

Component (B) contains $HOSiO_{3/2}$ units (TOH units), which account for the silicon-bonded hydroxyl content of the organopolysiloxane resin. The silicon-bonded hydroxyl content of component (B), as determined by $^{29}SiNMR$ spectrometry, is typically less than 2 percent by weight and preferably less than 1 percent by weight, based on the total weight of the resin.

Component (B) contains from 2.5 to 7.5 mole percent, and more preferably from 4.0 to 6.5 mole percent, of alkenyl groups. The mole percent of alkenyl groups in the resin is defined here as the ratio of the number of moles of alkenyl-containing siloxane units in the resin to the total number of moles of siloxane units in the resin, multiplied by 100. The total number of moles of siloxane units in the resin includes the M, Q, and TOH units described above. When the alkenyl content of the resin is less than 2.5 mole percent, the cured composition becomes soft and tacky and the ratio of the storage modulus at −65° C. to the storage modulus at 20° C. increases. When the alkenyl content of the resin is greater than 7.5 mole percent, the cured composition becomes hard and brittle, as evidenced by an increase in storage modulus, G'.

Component (B) can comprise a single organopolysiloxane resin or a mixture of two or more organopolysiloxane resins. For example, component (B) can comprise a mixture of a first resin containing 6.0 mole percent of vinyl groups and 50 percent by weight of a resin free of vinyl groups. Such organopolysiloxane would contain an average of about 3.0 mole percent of vinyl groups, thus meeting the required alkenyl content for component (A).

Component (B) can also contain a small amount of a low molecular weight material comprised substantially of a neopentamer organopolysiloxane having the formula $(R_3SiO)_4Si$, the latter material being a byproduct in the preparation of the resin according to the method of Daudt et al., described infra. Additionally, component (B) may contain minor amounts of diorganosiloxane and triorganosiloxane units.

Component (B) has a number-average molecular weight ($M_n$) of from 2,000 to 5,000, preferably from 2,000 to 4,000, and more preferably from 2,000 to 3,000 when measured by gel permeation chromatography (GPC), the neopentamer peak being excluded from the measurement. In this molecular weight determination, narrow fractions of MQ resins are used to calibrate the GPC equipment, the absolute molecular weights of the fractions being first ascertained by a technique such as vapor phase osmometry.

A preferred organopolysiloxane resin has a number-average molecular weight of about 2,500 and consists essentially of $(CH_3)_2CH_2=CHSiO_{1/2}$ siloxane units, $(CH_3)_3SiO_{1/2}$ siloxane units, and $SiO_{4/2}$ siloxane units, wherein the mole ratio of the combination of $(CH_3)_2CH_2=CHSiO_{1/2}$ units and $(CH_3)_3SiO_{1/2}$ units to $SiO_{4/2}$ units is about 1.0, and the resin contains about 6.0 mole percent of vinyl groups.

The concentration of component (B) in the composition of the present invention is critical with respect to the pre-cure viscosity and the properties achieved following curing, particularly thermal expansion and modulus. The concentration of component (B) is from 75 to 150 parts by weight and preferably from 90 to 125 parts by weight per 100 parts by weight of component (A). When the concentration of component (B) is less than 75 parts by weight, the coefficient of thermal expansion in the range from −50 to −40° C. and the storage modulus of the silicone elastomer at −65° C. increase significantly relative to their values at 20° C. At concentrations greater than 150 parts by weight, the viscosity of the uncured composition increases to the extent that it does not flow at a rate useful for commercial encapsulation processes.

Component (B) of the present invention can be prepared by treating a resin copolymer produced by the silica hydrosol capping process of Daudt et al., U.S. Pat. No. 2,676,182, as modified by Brady, U.S. Pat. No. 3,627,851, and Flannigan, U.S. Pat. No. 3,772,247, with an alkenyl-containing endblocking agent. The immediately preceding patents are hereby incorporated by reference to teach how to prepare organopolysiloxanes which meet the requirements of the present invention.

Briefly stated, the modified method of Daudt et al. used to prepare the organopolysiloxane resin of the present invention comprises limiting the concentration of the sodium silicate solution, and/or the silicon-to-sodium ratio in the sodium silicate, and/or the time before capping the neutralized sodium silicate solution to generally lower values than those disclosed by Daudt et al. in order to prevent excessive growth of the silica particles and to obtain an organopolysiloxane having the preferred $M_n$. Thus, the preferred silicate concentration is generally limited to a value of 40 to 120, preferably 60 to 100, and most preferably about 75 grams/liter. The neutralized silica hydrosol is preferably stabilized with an alcohol, such as isopropanol and capped with $(CH_3)_3SiO_{1/2}$ siloxane units as soon as possible, preferably within 30 seconds after being neutralized. The sodium silicate employed preferably has the formula $Na_2O.xSiO_2$, wherein x has a value of from 2 to 3.5. The resulting copolymers contain from 2 to 3 percent by weight of hydroxyl groups.

The resin of the present invention, which contains less than 2 percent by weight of silicon-bonded hydroxyl groups, can be prepared by reacting the product of the modified method of Daudt et al. with an alkenyl-containing silazane, siloxane, or silane in an amount sufficient to provide from 2.5 to 7.5 mole percent of alkenyl groups in the final product. Alkenyl-containing endblocking agents are known in the art and exemplified in U.S. Pat. No. 4,584,355 to Blizzard et al.; U.S. Pat No. 4,591,622 to Blizzard et al.; and U.S. Pat. No. 4,585,836 to Homan et al.; which are hereby incorporated by reference.

It will be understood that as the viscosity of component (A) increases in the range from 5 to 100 Pa.s, it may be necessary to decrease the concentration of the organopolysiloxane resin within the above-stated range to obtain a processable composition. Also, as the alkenyl content of the organopolysiloxane resin increases in the range from 2.5 to 7.5 mole percent, it may be necessary to reduce the concentration of the resin to obtain a silicone elastomer having satisfactory adhesion.

Component (C) of the present invention is an organohydrogenpolysiloxane having an average of at least three silicon-bonded hydrogen atoms per molecule and an average of no more than one silicon-bonded hydrogen atom per silicon atom. The silicon-bonded hydrogen atoms can be located at terminal, pendant, or at both terminal and pendant positions in the organohydrogenpolysiloxane. Component (C) can be a homopolymer or a copolymer. The structure of the organohydrogenpolysiloxane can be linear, branched, or cyclic. The siloxane units present in component (C) may include $HR^5_2SiO_{1/2}$, $R^5_3SiO_{1/2}$ $HR^5SiO_{2/2}$, $R^5_2SiO_{2/2}$, $HSiO_{3/2}$, $R^5SiO_{3/2}$, and $SiO_{4/2}$ units. In the preceding formulae each $R^5$ is independently selected from the group consisting of monovalent hydrocarbon and monovalent halogenated hydrocarbon groups free of aliphatic unsaturation, as defined previously for component (A). Typically at least 50 percent, and more preferably substantially all of the organic groups in component (C) are methyl. Component (C) can be a single organohydrogenpolysiloxane or a mixture of two or more different organohydrogenpolysiloxanes.

A preferred organohydrogenpolysiloxane comprises (i) a trimethylsiloxy-terminated dimethylmethylhydrogensiloxane having an average of five methylhydrogensiloxane units and three dimethylsiloxane units per molecule and a silicon-bonded hydrogen atom content of about 0.7 to 0.8 percent by weight and (ii) 10.4 percent by weight, based on the total weight of the component (C), of a trimethylsiloxy-terminated polymethylhydrogensiloxane having a silicon-bonded hydrogen content of 1.4 to 1.75 percent by weight and a viscosity of 0.02 to 0.04 Pa.s.

The concentration of component (C) in the composition of the present invention is sufficient to provide from one to three silicon-bonded hydrogen atoms per alkenyl group in components (A) and (B) combined.

Organohydrogenpolysiloxanes which are suitable for use in the composition of the present invention and methods for their preparation are well known in the art.

To ensure compatibility of components (A), (B), and (C), described supra, the predominant organic group in each component is preferably the same. Preferably this group is methyl.

Component (D) of the present invention is an adhesion promoter that effects strong unprimed adhesion of the silicone composition to substrates commonly employed in the construction of electronic devices; for example, silicon; passivation coatings, such as silicon dioxide and silicon nitride; glass; metals, such as copper and gold; ceramics; and organic resins, such as polyimide. Component (D) can be any adhesion promoter typically employed in silicone compositions, provided it is soluble in the present composition and does not adversely affect the physical properties of the cured product, particularly the coefficient of thermal expansion and the storage modulus. Component (D) can be a single adhesion promoter or a mixture of two or more different adhesion promoters.

The concentration of component (D) in the composition of the present invention can vary over a wide range depending on the nature of the adhesion promoter and substrate material. Preferably, the concentration of component (D) is sufficient to achieve at least a 50% increase in the peel adhesion of the cured composition on polyimide relative to the peel adhesion of the same composition without the adhesion promoter. Generally, the adhesion promoter comprises from 0.01 to about 10 percent by weight of the present composition. However, the optimum concentration of component (D) can be readily determined by routine experimentation.

Preferred adhesion promoters according to the present invention include, but are not limited to, adhesion promoters comprising (i) a polysiloxane having an average of at least one silicon-bonded alkenyl group and an average of at least one silicon-bonded hydroxyl group per molecule and (ii) an epoxy-containing alkoxysilane. Polysiloxane (i) has an average of less than 15 silicon atoms and preferably from 3 to 15 silicon atoms per molecule. The silicon-bonded organic groups in component (i) are independently selected from the group consisting of monovalent alkyl groups having less than 7 carbon atoms, phenyl, and alkenyl having 2 to 6 carbon atoms. Suitable monovalent alkyl groups are exemplified by, but not limited to methyl, ethyl, propyl, and butyl.

Preferably, the monovalent alkyl group is methyl. Examples of alkenyl groups include, but are not limited to vinyl, allyl, 2-propenyl, and 6-hexenyl. Preferably, the alkenyl group is vinyl.

The silicon-bonded hydroxyl and silicon-bonded alkenyl groups in polysiloxane (i) can be located at terminal, pendant, or at both terminal and pendant positions in the polysiloxane. Polysiloxane (i) can be a homopolymer or a copolymer. The structure of the polysiloxane can be linear, branched, or cyclic. The siloxane units in component (i) may include $CH_2=CHSiO_{1.5}$, $C_6H_5SiO_{1.5}$, $HOSiO_{1.5}$, $R^6(CH_2=CH)SiO$, $R^6(HO)SiO_{1.5}$, $R^6(C_6H_5)SiO$, $(C_6H_5)_2SiO$, $(C_6H_5)(CH_2=CH)SiO$, $(C_6H_5)(HO)SiO$, $(CH_2=CH)(HO)SiO$, $(HO)R^6{}_2SiO_{0.5}$, $(CH_2=CH)R^6{}_2SiO_{0.5}$, $(HO)(CH_2=CH)R^6SiO_{0.5}$, and $(HO)(C_6H_5)R^6SiO_{0.5}$, where $R^6$ is a monovalent alkyl group having less than 7 carbon atoms as defined above. Polysiloxane (i) can be a single polysiloxane or a mixture of two or more different polysiloxanes. Preferably, polysiloxane (i) is a hydroxyl-terminated polydiorganosiloxane, wherein the diorganosiloxane units are methylvinylsiloxane and dimethylsiloxane units. Such polysiloxanes and methods for their preparation are well known in the art.

Epoxy-containing alkoxysilane (ii) contains at least one epoxy-containing organic group and at least one silicon-bonded alkoxy group. The alkoxy groups in epoxy-containing alkoxysilane (ii) typically have less than 5 carbon atoms and are exemplified by methoxy, ethoxy, propoxy, and butoxy. Methoxy is a preferred alkoxy group. Preferably, the epoxy-containing organic group has the formula

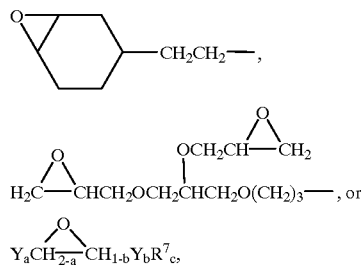

wherein each Y is independently an alkyl group having 1 or 2 carbon atoms; a is 0, 1, or 2; b and c are each 0 or 1; and $R^7$ is a divalent hydrocarbon group having no more than 12 carbon atoms. Preferably, $R^7$ is selected from the group consisting of a saturated aliphatic hydrocarbon group, an arylene group, and a divalent group having the formula

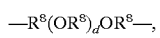

wherein $R^8$ is a divalent saturated aliphatic hydrocarbon group having 2 to 6 carbon atoms and d has a value of from 0 to 8.

The remaining silicon-bonded organic groups in the epoxy-containing alkoxysilane are independently selected from the group consisting of monovalent hydrocarbon groups having less than 7 carbon atoms and monovalent fluorinated alkyl groups having less than 7 carbon atoms. The monovalent hydrocarbon groups are exemplified by, but not limited to, alkyl, such as methyl, ethyl, propyl, hexyl; alkenyl, such as vinyl; and the monovalent fluorinated alkyl groups include, but are not limited to, aryl, such as phenyl. Examples of suitable fluorinated alkyl groups include, but are not limited to, perfluoroalkyl, such as 3,3,3-trifluoropropyl, β-(perfluoroethyl)ethyl, and β-(perfluoropropyl)ethyl.

The structure of epoxy-containing alkoxysilane (ii) can be linear, branched, or cyclic. Silane (ii) can be a single silane or a mixture of two or more different silanes. Preferably, epoxy-containing alkoxysilane (ii) is a mono(epoxyorgano)trialkoxysilane. A particularly preferred epoxy-containing alkoxysilane is glycidoxypropyltrimethoxysilane. Methods for the preparation of such silanes are well known in the art.

The two components of the aforementioned adhesion promoter can be either added separately or as a blend to the composition of the present invention. Such compositions also typically contain up to 10 percent by weight of at least one reaction product of the hydroxy-containing polysiloxane and the alkoxysilane, which is normally formed during storage under ambient conditions.

A specific example of a preferred adhesion promoter according to the present invention is a blend comprising 43.5 percent by weight of a hydroxyl-terminated polymethylvinylsiloxane containing 2.25 to 4 percent by weight of silicon-bonded hydroxyl groups and 27.5 percent by weight of vinyl groups, 50 percent by weight of glycidoxypropyltrimethoxysilane, and 6.5 percent by weight of a reaction product of the hydroxyl-terminated polymethylvinylsiloxane and glycidoxypropyltrimethoxysilane.

The preceding class of adhesion promoters is disclosed in U.S. Pat. No. 4,087,585, which is hereby incorporated by reference to teach adhesion promoters suitable for use in the composition of the present invention.

Preferred adhesion promoters according to the present invention also include organosilicon compounds having the average formula:

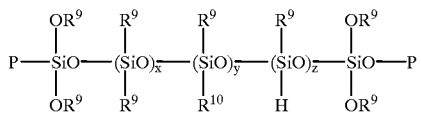

wherein $R^9$ is a monovalent hydrocarbon group free of aliphatic unsaturation, $R^{10}$ is alkenyl, x has a value of from 0 to 10, y has a value of from 0 to 10, z has a value of 0 to 10, the sum y+z is at least 1, and P has the formula:

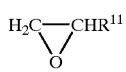

wherein $R^{11}$ is a divalent organic group. Suitable $R^9$ groups generally contain from 1 to about 6 carbon atoms and are exemplified by, but not limited to methyl, ethyl, propyl, and butyl. Preferably, $R^9$ is methyl. The $R^{10}$ groups typically have from 2 to about 6 carbon atoms and include, but are not limited to, vinyl, allyl, 1-propenyl, and isopropenyl. Preferably, $R^{10}$ is vinyl. Examples of $R^{11}$ groups include, but are not limited to methylene, ethylene, propylene, phenylene, chloroethylene, fluoroethylene, $-CH_2OCH_2CH_2CH_2-$, $-CH_2CH_2OCH_2CH_2-$, $-CH_2CH_2OCH(CH_3)CH_2-$, and $-CH_2OCH_2CH_2OCH_2CH_2-$. Preferably, $R^{11}$ is $-CH_2OCH_2CH_2CH_2-$. The preceding class of adhesion promoters, inter alia, is exemplified in U.S. Pat. No. 4,082,726, which is hereby incorporated by reference. Methods for the preparation of these organosilicon compounds from hydroxy-terminated diorganosiloxanes and epoxy-containing alkoxysilanes are well known in the art.

Specific examples of such preferred adhesion promoters according to the present invention are

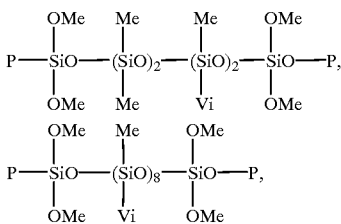

and mixtures thereof, wherein P is

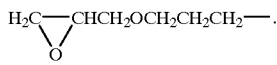

Component (E) of the present invention is a hydrosilylation catalyst comprising a platinum group metal or a compound containing such a metal that promotes the addition reaction of components (A) and (B) with component (C). These metals include platinum, rhodium, ruthenium, palladium, osmium and iridium. Platinum and platinum compounds are preferred based on the high activity level of these catalysts in hydrosilylation reactions. A preferred class of platinum catalysts are the complexes of chloroplatinic acid with certain vinyl-containing organosiloxane compounds disclosed by Willig in U.S. Pat. No. 3,419,593, which is hereby incorporated by reference. A particularly preferred catalyst of this type is the reaction product of chloroplatinic acid and 1,3-diethenyl-1,1,3,3-tetramethyldisiloxane.

The hydrosilylation catalyst is present in an amount sufficient to cure the composition of the present invention. Typically, the concentration of component (E) is sufficient to provide from 0.1 to 1000, preferably from 1 to 500, and more preferably from 1 to 50 parts per million of a platinum group metal, based on the combined weight of components (A), (B), and (C). The rate of cure is very slow below 0.1 ppm of platinum group metal. The use of more than 1000 ppm of platinum group metal results in no appreciable increase in cure rate, and is therefore uneconomical.

Mixtures of the aforementioned components (A), (B), (C), and (D), and (E) may begin to cure at ambient temperature. To obtain a longer working time or "pot life", the activity of the catalyst under ambient conditions can be retarded or suppressed by the addition of a suitable inhibitor to the composition of the present invention. A platinum catalyst inhibitor retards curing of the present composition at ambient temperature, but does not prevent the composition from curing at elevated temperatures. In order to be effective in this invention, the platinum catalyst inhibitor must be soluble in the composition. Suitable platinum catalyst inhibitors include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-1-cyclohexanol, and 2-Phenyl-3-butyn-2-ol; maleates and fumarates, such as the well known dialkyl, dialkenyl, and dialkoxyalkyl fumarates and maleates; cyclovinylsiloxanes; and benzyl alcohol.

Acetylenic alcohols constitute a preferred class of inhibitors due to their high activity in hydrosilylation reactions. 3,5-Dimethyl-1-hexyn-3-ol is a particularly preferred inhibitor in the composition of the present invention. Compositions containing these inhibitors generally require heating at 70° C. or above to cure at a practical rate.

The concentration of platinum catalyst inhibitor in the present composition is sufficient to retard curing of the composition at ambient temperature without preventing or excessively prolonging cure at elevated temperatures. This concentration will vary widely depending on the particular inhibitor used, the nature and concentration of the hydrosilylation catalyst, and the nature of the organohydrogenpolysiloxane.

Inhibitor concentrations as low as one mole of inhibitor per mole of platinum group metal will in some instances yield a satisfactory storage stability and cure rate. In other instances, inhibitor concentrations of up to 500 or more moles of inhibitor per mole of platinum group metal may be required. Generally, the inhibitor is present in an amount from 1 to 100 moles per mole of platinum group metal. The optimum concentration for a particular inhibitor in a given composition can be readily determined by routine experimentation.

The composition of the present invention may further comprise an inorganic filler. Fillers suitable for use in the composition of the present invention have a high radiological purity; low coefficient of thermal expansion; low levels of ionic impurities such as sodium, potassium, and chloride; and low moisture content. Examples of preferred fillers include, but are not limited to fused silica (fused quartz), alumina, boron nitride, and aluminum nitride. Fused silica is a particularly preferred filler in compositions used to encapsulate random access memory (RAM) devices, which are very sensitive to alpha particle emissions.

The average particle size of the filler is typically from 2 to 25 $\mu$m and preferably from 2 to 10 $\mu$m. When the average particle size is less than about 2 $\mu$m, the viscosity of the composition may be too high for use in conventional encapsulation processes. When the average particle size is greater than about 25 $\mu$m, the particles may be excluded by the comparatively smaller dimensions of a semiconductor device. Also, the larger filler particles tend to settle in the composition rather than remaining in suspension.

Although, the shape of the filler particles is not critical, particles having a spherical shape are preferred because they generally impart a smaller increase in viscosity to the composition than particles having other shapes.

The concentration of filler in the present composition is typically from 10 to 300 parts by weight per 100 parts by weight of component (A). However, the filler should not be used in an amount that increases the viscosity of the composition above about 60 Pa.s at 25° C. prior to cure, the viscosity measured using a controlled stress viscometer at a sheer rate of 0.1 sec$^{-1}$. Above the specified viscosity, the composition is too viscous for practical use in conventional encapsulation processes. It will be understood that as the concentration of the inorganic filler increases in the range from 10 to 300 parts by weight per 100 parts by weight of component (A), it may be necessary to reduce the concentration of component (B) within the aforementioned range to achieve a processable composition.

The composition of the instant invention is typically prepared by combining components (A) through (E) and, optionally a filler and/or inhibitor, in the stated proportions. Mixing can be accomplished by any of the techniques known in the art such as milling, blending, and stirring, either in a batch or continuous process. The particular device is determined by the viscosity of the components and the final composition. Preferably, the hydrosilylation catalyst is added last at a temperature below about 30° C. to prevent premature curing of the composition and thus ensure adequate working time.

Alternatively, the composition of the present invention can be a multi-part composition comprising components (A)

through (E) in two or more parts. The multi-part composition can contain any number of parts, provided that neither the polydiorganosiloxane nor the organopolysiloxane resin are present with the organohydrogenpolysiloxane and hydrosilylation catalyst in the same part. In a typical method for preparing such a composition, a portion of the polydiorganosiloxane, a portion of the organopolysiloxane resin, the adhesion promoter, the hydrosilylation catalyst, and any filler or additives are mixed together to produce Part A, and the remaining portions of the polydiorganosiloxane and resin, organohydrogenpolysiloxane, and platinum catalyst inhibitor are mixed together to produce part B. Preferably, the components are packaged in such a manner that equal weight amounts of each package can be mixed to produce the one part composition of this invention.

The compositions of the present invention should be stored in sealed containers to prevent exposure to air and moisture. The one part composition of the present invention may be stored at room temperature for several weeks without any change in the properties of the cured encapsulant product. However, the shelf life of the composition of this invention can be extended to several months by storing the mixtures at a temperature below 0° C. and preferably from −30 to −20° C. Individual sealed packages of the multi-part composition described above can be stored for over 6 months at ambient conditions without any deterioration in the performance of the composition produced upon their admixture.

The composition of this invention can be cured by heating at temperatures of from 70 to 200° C., preferably from 100 to 150° C., for a suitable length of time. For example, the composition typically cures in about one hour at 150° C.

In general, the composition of the present invention can further comprise small amounts of additional ingredients typically used in the formulation of silicone compositions, such as antioxidants, pigments, stabilizers, and fillers, provided the ingredient does not adversely affect the physical properties of the cured product, particularly the coefficient of thermal expansion and the storage modulus. Carbon black is a preferred pigment in the present composition.

The composition of the present invention is particularly useful as an encapsulant in chip scale packages. As used herein the term "chip scale" conforms to the definition proposed by the Electronic Industries Association and the Institute for Interconnecting and Packaging Electronic Circuits in standard J-Std-012, "Implementation of Flip Chip and Chip Scale Technology," January 1996, p. 1. Section 1.2 of the document defines chip scale technology as follows: "Chip scale technology is categorized as semiconductor chip structures that have been made robust to facilitate ease of chip handling, testing, and chip assembly. The chip scale technologies have common attributes of minimal size, no more than 1.2× the area of the original die size, and are direct surface mountable."

The chip scale package of the present invention comprises a semiconductor chip, a supporting substrate, at least one member connecting the semiconductor chip to the substrate, and the silicone composition described above. There are no restrictions on the semiconductor chip employed in the chip scale package of the present invention. The supporting substrate can be substantially rigid, semi-rigid, or flexible. However, typically the supporting substrate is comprised of a flexible dielectric film. Preferably, the dielectric film is a polymeric material such as polyimide. The member connecting the chip to the substrate typically comprises wire leads and solder connections. Chip scale packages according to the present invention are exemplified by, but not limited to, the flexible interposer type chip scale packages disclosed by T. Chung in "Updates on Worldwide Chip Scale Packaging (II)", the relevant portions of which are herein incorporated by reference. U.S. Pat. No. 5,659,952 to Kovac et al. and U.S. Pat. No. 5,663,106 to Karavakis et al. disclose preferred chip scale packages, which include an encapsulation material. The preceding patents are hereby incorporated by reference to teach methods of fabricating chip scale packages suitable for use with the composition of the present invention.

EXAMPLES

The following examples are presented to further illustrate the composition of this invention, but are not to be considered as limiting the invention, which is delineated in the appended claims. All parts and percentages reported in the examples are by weight. The following methods and materials were employed in the Examples:

Cured silicone compositions having a thickness of about 1.9 mm were prepared by compression molding a curable composition between two Teflon-lined aluminum plates under a pressure of about 10,000 Kg at room temperature for about two minutes. The plates were transferred to a hot press and maintained under a pressure of about 10,000 Kg at 150° C. for fifteen minutes. The plates were immediately removed from the hot press and placed in an oven at 150° C. for 1 hour. After allowing the plates to cool to room temperature, the cured composition was carefully removed from the die assembly.

The number-average molecular weight ($M_n$) of an organopolysiloxane resin were determined by gel permeation chromatograpy (GPC) using Varian TSK 4000+2500 columns at 35° C., a chloroform mobile phase at 1 mL/min, and a refractive index detector. Narrow fractions of MQ resins were used to calibrate the GPC equipment.

The viscosity of a polymer or curable composition was determined using a Rheometrics SR-5000 controlled-stress rheometer equipped with parallel plate test fixtures having a diameter of 25 mm. The thickness of the sample was 1 mm and the instrument was operated in a steady sheer mode at 25±1° C. Stress was increased linearly form 0 to 100 Pa over a period of five minutes, held at 100 Pa for 1 minute, and then reduced linearly to zero during a five minute period. The maximum viscosity of the composition was measured at sheer rates of 0.1 $sec^{-1}$ and 1 $sec^{-1}$.

The coefficient of thermal expansion of a cured composition was determined using a TA Instruments TMA 2940 thermomechanical analyzer. A sample having a diameter of 8 mm and a thickness of 1.9 mm was equilibrated at −155° C. and thereafter the temperature was increased at a rated of 5° C./min to 200° C. The coefficient of thermal expansion was calculated by dividing the secant to the temperature versus dimensional change curve in the temperature range from −50 to −40° C. by the sample thickness.

The storage modulus (G') of a cured composition was determined using a Rheometrics Dynamic Analyzer RDA II. The instrument was operated in the torsional rectangular bar mode with a frequency of 10 radians/s. A sample having a length of 36 mm, width of 12.7 mm, and thickness of 1.9 mm was held at −85° C. for twenty minutes and then increased at a rate of 3° C./min to 50° C. Storage moduli were measured at −65 and 20° C.

The tensile strength and elongation of a cured sample were determined in accordance with ASTM D 412C using a Monsanto T2000 tensiometer quipped with a type C die. Tensile strength and elongation measurements were carried out by taking the samples to ultimate failure.

The hardness of a cured sample was measured using a Durometer Type A instrument. Three cured samples, each having a thickness of 1.9 mm, were stacked vertically and the hardness of the top exposed surface was measured.

The peel adhesion of a cured composition on a polyimide substrate were measured using a Monsanto T2000 tensiometer. The curable composition was interposed between two square polyimide films, each having a thickness of 0.05 mm and width of 12.7 mm, spaced about 0.20 mm apart. The laminate was cured in an oven at 150° C. for 1 hour and then allowed to cool to room temperature. The force required to remove the polyimide films from the cured composition was measured at a peel angle of 180° and a peel rate of 5.1 cm per minute. The peel adhesion for one sample is an average of multiple readings taken during the course of one peel. The recorded values are the average peel adhesion of three identically prepared samples.

Polymer Blend: a mixture consisting of 75 percent by weight of a dimethylvinylsiloxy-terminated polydimethylsiloxane having an average DP of 830 and a viscosity of 55 Pa.s at 25° C., and 25 percent by weight of a dimethylvinylsiloxy-terminated polydimethylsiloxane having an average DP of 434 and a viscosity of 2 Pa.s at 25° C.

Resin: an organopolysiloxane having a Mn of about 2,500 and consisting of $(CH_3)_2CH_2=CHSiO_{1/2}$ siloxane units, $(CH_3)_3SiO_{1/2}$ siloxane units, and $SiO_{4/2}$ siloxane units, wherein the mole ratio of the combination of $(CH_3)_2CH_2=CHSiO_{1/2}$ units and $(CH_3)_3SiO_{1/2}$ units to $SiO_{4/2}$ units is about 1.0, and the resin contains about 6.0 mole percent of vinyl groups.

Crosslinking Agent A: a trimethylsiloxy-terminated dimethylmethylhydrogensiloxane having an average of five methylhydrogensiloxane units and three dimethylsiloxane units per molecule and a silicon-bonded hydrogen content of about 0.7 to 0.8 percent by weight.

Crosslinking Agent B: a trimethylsiloxy-terminated polymethylhydrogensiloxane having a silicon-bonded hydrogen content of 1.4 to 1.75 percent by weight and a viscosity of 0.02 to 0.04 Pa.s.

Adhesion Promoter: a blend consisting of 43.5 percent by weight of a hydroxyl-terminated dimethylmethylvinylsiloxane containing 2.25 to 4 percent by weight of silicon-bonded hydroxyl groups and 27.5 percent by weight of vinyl groups, 50 percent by weight of glycidoxypropyltrimethoxysilane, and 6.5 percent by weight of a reaction product of the hydroxyl-terminated polymethylvinylsiloxane and glycidoxypropyltrimethoxysilane.

Inhibitor: 3,5-dimethyl-1-hexyn-3-ol.

Catalyst: a platinum complex of 1,3-diethenyl-1,1,3,3-tetramethyldisiloxane.

Pigment: carbon black.

Example 1

A silicone composition according to the present invention was prepared by mixing 100 parts of Polymer Blend, 100 parts of Resin, 19.0 parts of Crosslinking Agent A, 2.2 parts of Crosslinking Agent B, 4.8 parts of Adhesion Promoter, 2.4 parts of Pigment, and 0.2 parts of Inhibitor. Catalyst (0.01 parts) was added to the mixture and stirring was continued for an additional 2 minutes. The viscosity of the composition is 18.1 Pa.s at a strain rate of 0.1 sec$^{-1}$ and 12.7 Pa.s at a strain rate of 1.0 sec$^{-1}$. The physical properties of the cured composition are shown in Table 1.

Comparative Example 1

A silicone composition was prepared using the method described in Example 1 and the following concentrations of components: 100 parts of Polymer Blend, 33.3 parts of Resin, 8.2 parts of Crosslinking Agent A, 0.95 parts of Crosslinking Agent B, 3.2 parts of Adhesion Promoter, and 1.6 parts of Pigment, 0.16 parts of Inhibitor, and 0.01 parts of Catalyst. The viscosity of the composition is 25.9 Pa.s at a sheer rate of 0.1 sec. and 20.3 Pa.s at a sheer rate of 1.0 sec$^{-1}$. The physical properties of the cured composition are shown in Table 1.

Comparative Example 2

A silicone composition was prepared using the method described in Example 1 and the following concentrations of components: 100 parts of Polymer Blend, 66.7 parts of Resin, 13.6 parts of Crosslinking Agent A, and 1.6 parts of Crosslinking Agent B, 4.0 parts of Adhesion Promoter, 2.0 parts of Pigment, 0.20 parts of Inhibitor, and 0.01 parts of Catalyst. The viscosity of the composition is 17.2 Pa.s at a sheer rate of 0.1 sec$^{-1}$ and 12.9 Pa.s at a sheer rate of 1.0 sec$^{-1}$. The physical properties of the cured composition are shown in Table 1.

Comparative Example 3

A silicone composition absent Adhesion Promoter was prepared using the method described in Example 1 and the following concentrations of components: 100 parts of Polymer Blend, 100 parts of Resin, 15.1 parts of Crosslinking Agent A, 1.8 parts of Crosslinking Agent B, 2.4 parts of pigment, 0.24 parts of Inhibitor, and 0.01 parts of Catalyst. The viscosity of the composition is 15.6 Pa.s at a sheer rate of 0.1 sec$^{-1}$ and 14.7 Pa.s at a sheer rate of 1.0 sec$^{-1}$. The physical properties of the cured composition are shown in Table 1.

Example 2

A silicone composition identical to the composition in Example 1 was prepared, except 119 parts by weight of fused silica, having an average particle size of 4.5±0.5 microns, was added to the composition after admixing the inhibitor. The viscosity of the composition is 64.6 Pa.s at a sheer rate of 0.1 sec$^-$and 27.0 Pa.s at a sheer rate of 1.0 sec$^{-1}$. The physical properties of the cured composition are shown in Table 1.

Comparative Example 4

A silicone composition identical to the composition in Example 2 was prepared, except the concentration of fused silica was 238 parts by weight. The viscosity of the composition is 379.3 Pa.s at a sheer rate of 0.1 sec$^{-1}$ and 91.0 Pa.s at a sheer rate of 1.0 sec$^{-1}$. The physical properties of the cured composition are shown in Table 1.

TABLE 1

| Physical Properties | Examples | | Comparative Examples | | | |
|---|---|---|---|---|---|---|
| | 1 | 2 | 1 | 2 | 3 | 4 |
| Durometer Hardness (Shore A Scale) | 75 | 83 | 41 | 61 | 73 | 89 |
| Tensile Strength (MPa) | 8.1 | 5.5 | 4.5 | 6.7 | 6.6 | 5.0 |
| Elongation (%) | 69 | 36 | 189 | 143 | 69 | 22 |
| CTE ($\mu$m/m° C.) −50 to −40° C. | 246 | 214 | 750 | 326 | 247 | 144 |
| G' (MPa) | | | | | | |

TABLE 1-continued

| Physical Properties | Examples | | Comparative Examples | | | |
|---|---|---|---|---|---|---|
| | 1 | 2 | 1 | 2 | 3 | 4 |
| −65° C. | 40.1 | 91.8 | 98.1 | 60 | 33.3 | 203 |
| 20° C. | 8.7 | 20.4 | 0.74 | 2.6 | 7.8 | 36.3 |
| 180° Peel Adhesion (N/m) | 149[c] | 121[c] | 897[c] | 658[c] | 79[a] | 103[c] |

CTE = coefficient of thermal expansion, G' = storage modulus, a = adhesive failure, and c = cohesive failure.

That which is claimed is:

1. A silicone composition comprising:
   (A) 100 parts by weight of a polydiorganosiloxane containing an average of at least two silicon-bonded alkenyl groups per molecule;
   (B) 75 to 150 parts by weight of an organopolysiloxane resin having a number-average molecular weight of from 2,000 to 5,000 and consisting essentially of $R^3_2R^4$ $SiO_{1/2}$ units and $SiO_{4/2}$ units wherein each $R^3$ is independently selected from the group consisting of monovalent hydrocarbon and monovalent halogenated hydrocarbon groups free of aliphatic unsaturation, $R^4$ is selected from the group consisting of $R^3$ and alkenyl groups, the mole ratio of $R^3_2R^4$ $SiO_{1/2}$ units to $SiO_{4/2}$ units is from 0.6:1 to 1.1:1, and the resin contains an average of from 2.5 to 7.5 mole percent of alkenyl groups;
   (C) an organohydrogenpolysiloxane having an average of at least three silicon-bonded hydrogen atoms per molecule in an amount sufficient to provide from one to three silicon-bonded hydrogen atoms per alkenyl group in components (A) and (B) combined;
   (D) an adhesion promoter in an amount sufficient to effect adhesion of the composition to a substrate; and
   (E) a hydrosilylation catalyst in an amount sufficient to cure the composition.

2. The composition according to claim 1, wherein the polydiorganosiloxane comprises a mixture of a first polydiorganosiloxane having a viscosity of from 45 to 65 Pa.s at 25° C. and a second polydiorganosiloxane having a viscosity of from 1.8 to 2.4 Pa.s at 25° C.

3. The composition according to claim 1, wherein the adhesion promoter comprises a mixture of (i) a polysiloxane having an average of at least one silicon-bonded alkenyl group and an average of at least one silicon-bonded hydroxyl group per molecule and (ii) an epoxy-containing alkoxysilane.

4. The composition according to claim 3, wherein the polysiloxane is a hydroxyl-terminated dimethylmethylvinylsiloxane and the epoxy-containing alkoxysilane is glycidoxypropyltrimethoxysilane.

5. The composition according to claim 1, wherein the adhesion promoter is an organosilicon compound having the average formula:

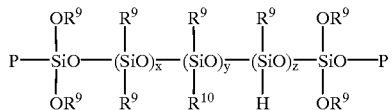

wherein $R^9$ is a monovalent hydrocarbon group free of aliphatic unsaturation, $R^{10}$ is an alkenyl group, x has a value of from 0 to 10, y has a value of from 0 to 10, z has a value of from 0 to 10, the sum y+z is at least 1, and P has the formula:

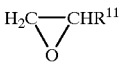

wherein $R^{11}$ is a divalent organic group.

6. The composition according to claim 5, wherein $R^9$ is methyl, $R^{10}$ is vinyl, x has an average value of 2, y has an average value of 2, z is 0, and $R^{11}$ is —$CH_2OCH_2CH_2CH_2$—.

7. The composition according to claim 1, further comprising an inorganic filler selected from the group consisting of alumina, boron nitride, aluminum nitride, and fused silica.

8. The composition according to claim 7, wherein the inorganic filler is fused silica.

9. The composition according to claim 1, wherein the polydiorganosiloxane has the general formula $R^2R^1_2SiO$ $(R^1_2SiO)_nSiR^1_2R^2$ wherein each $R^1$ is independently selected from the group consisting of monovalent hydrocarbon and monovalent halogenated hydrocarbon groups free of aliphatic unsaturation, $R^2$ is alkenyl, and n has a value such that the viscosity of the polydiorganosiloxane is from 0.5 to 100 Pa.s at 25° C.; the organopolysiloxane resin consists essentially of $(CH_3)_2CH_2$=$CHSiO_{1/2}$ units, $(CH_3)_3SiO_{1/2}$ units, and $SiO_{4/2}$ units; the organohydrogenpolysiloxane comprises a mixture of a trimethylsiloxy-terminated dimethylmethylhydrogensiloxane and (ii) a trimethylsiloxy-terminated polymethylhydrogensiloxane; and the hydrosilylation catalyst is a platinum catalyst.

10. A silicone elastomer, comprising a reaction product of the composition of claim 1.

11. A silicone elastomer, comprising a reaction product of the composition of claim 3.

12. A silicone elastomer, comprising a reaction product of the composition of claim 5.

13. A silicone elastomer, comprising a reaction product of the composition of claim 7.

14. A silicone elastomer, comprising a reaction product of the composition of claim 9.

15. A multi-part silicone composition, comprising:
   (A) 100 parts by weight of a polydiorganosiloxane containing an average of at least two silicon-bonded alkenyl groups per molecule;
   (B) 75 to 150 parts by weight of an organopolysiloxane resin having a number-average molecular weight of from 2,000 to 5,000 and consisting essentially of $R^3_2R^4$ $SiO_{1/2}$ units and $SiO_{4/2}$ units wherein each $R^3$ is independently selected from the group consisting of monovalent hydrocarbon and monovalent halogenated hydrocarbon groups free of aliphatic unsaturation, $R^4$ is selected from the group consisting of $R^3$ and alkenyl groups, the mole ratio of $R^3_2R^4$ $SiO_{1/2}$ units to $SiO_{4/2}$ units is from 0.6:1 to 1.1:1, and the resin contains an average of from 2.5 to 7.5 mole percent of alkenyl groups;
   (C) an organohydrogenpolysiloxane having an average of at least three silicon-bonded hydrogen atoms per molecule in an amount sufficient to provide from one to three silicon-bonded hydrogen atoms per alkenyl group in components (A) and (B) combined;
   (D) an adhesion promoter in an amount sufficient to effect adhesion of the composition to a substrate; and
   (E) a hydrosilylation catalyst in an amount sufficient to cure the composition; wherein neither the polydiorganosiloxane nor the organopolysiloxane resin are present with the organohydrogenpolysiloxane and the hydrosilylation catalyst in the same part.

16. The composition according to claim 15, wherein the adhesion promoter comprises a mixture of (i) a polysiloxane having an average of at least one silicon-bonded alkenyl group and an average of at least one silicon-bonded hydroxyl group per molecule and (ii) an epoxy-containing alkoxysilane.

17. The composition according to claim 16, wherein the polysiloxane is a hydroxyl-terminated dimethylmethylvinylsiloxane and the epoxy-containing alkoxysilane is glycidoxypropyltrimethoxysilane.

18. The composition according to claim 15, wherein the adhesion promoter is an organosilicon compound having the average formula:

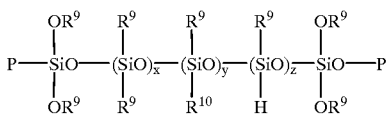

wherein $R^9$ is a monovalent hydrocarbon group free of aliphatic unsaturation, $R^{10}$ is alkenyl, x has a value of from 0 to 10, y has a value of from 0 to 10, z has a value of from 0 to 10, the sum y+z is at least 1, and P has the formula:

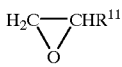

wherein $R^{11}$ is a divalent organic group.

19. The composition according to claim 18, wherein $R^9$ is methyl, $R^{10}$ is vinyl, x has an average value of 2, y has an average value of 2, z is 0, and $R^{11}$ is —$CH_2OCH_2CH_2CH_2$—.

20. The composition according to claim 15, wherein the polydiorganosiloxane has the general formula $R^2R^1{}_2SiO(R^1{}_2SiO)_nSiR^1{}_2R^2$ wherein each $R^1$ is independently selected from the group consisting of monovalent hydrocarbon and monovalent halogenated hydrocarbon groups free of aliphatic unsaturation, $R^2$ is alkenyl, and n has a value such that the viscosity of the polydiorganosiloxane is from 0.5 to 100 Pa.s at 25° C.; the organopolysiloxane resin consists essentially of $(CH_3)_2CH_2=CHSiO_{1/2}$ units, $(CH_3)_3SiO_{1/2}$ units, and $SiO_{4/2}$ units; the organohydrogenpolysiloxane comprises a mixture of a trimethylsiloxy-terminated dimethylmethylhydrogensiloxane and (ii) a trimethylsiloxy-terminated polymethylhydrogensiloxane; and the hydrosilylation catalyst is a platinum catalyst.

21. The composition according to claim 15, further comprising an inorganic filler selected from the group consisting of alumina, boron nitride, aluminum nitride, and fused silica.

22. A composition prepared by a process comprising the step of mixing:
(A) 100 parts by weight of a polydiorganosiloxane containing an average of at least two silicon-bonded alkenyl groups per molecule;
(B) 75 to 150 parts by weight of an organopolysiloxane resin having a number-average molecular weight of from 2,000 to 5,000 and consisting essentially of $R^3{}_2R^4 SiO_{1/2}$ units and $SiO_{4/2}$ units wherein each $R^3$ is independently selected from the group consisting of monovalent hydrocarbon and monovalent halogenated hydrocarbon groups free of aliphatic unsaturation, $R^4$ is selected from the group consisting of $R^3$ and alkenyl groups, the mole ratio of $R^3{}_2R^4 SiO_{1/2}$ units to $SiO_{4/2}$ units is from 0.6:1 to 1.1:1, and the resin contains an average of from 2.5 to 7.5 mole percent of alkenyl groups;
(C) an organohydrogenpolysiloxane having an average of at least three silicon-bonded hydrogen atoms per molecule in an amount sufficient to provide from one to three silicon-bonded hydrogen atoms per alkenyl group in components (A) and (B) combined;
(D) an adhesion promoter in an amount sufficient to effect adhesion of the composition to a substrate; and
(E) a hydrosilylation catalyst in an amount sufficient to cure the composition.

23. The composition according to claim 22, wherein the adhesion promoter comprises a mixture of (i) a polysiloxane having an average of at least one silicon-bonded alkenyl group and an average of at least one silicon-bonded hydroxyl group per molecule and (ii) an epoxy-containing alkoxysilane.

24. The composition according to claim 23, wherein the polysiloxane is a hydroxyl-terminated dimethylmethylvinylsiloxane and the epoxy-containing alkoxysilane is glycidoxypropyltrimethoxysilane.

25. The composition according to claim 22, wherein the adhesion promoter is an organosilicon compound having the average formula:

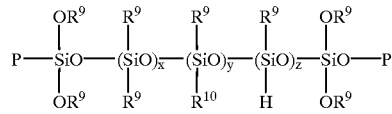

wherein $R^9$ is a monovalent hydrocarbon group free of aliphatic unsaturation, $R^{10}$ is alkenyl, x has a value of from 0 to 10, y has a value of from 0 to 10, z has a value of from 0 to 10, the sum y+z is at least 1, and P has the formula:

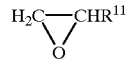

wherein $R^{11}$ is a divalent organic group.

26. The composition according to claim 25, wherein $R^9$ is methyl, $R^{10}$ is vinyl, x has an average value of 2, y has an average value of 2, z is 0, and $R^{11}$ is —$CH_2OCH_2CH_2CH_2$—.

27. The composition according to claim 22, wherein wherein the polydiorganosiloxane has the general formula $R^2R^1{}_2SiO(R^1{}_2SiO)_nSiR^1{}_2R^2$ wherein each $R^1$ is independently selected from the group consisting of monovalent hydrocarbon and monovalent halogenated hydrocarbon groups free of aliphatic unsaturation, $R^2$ is alkenyl, and n has a value such that the viscosity of the polydiorganosiloxane is from 0.5 to 100 Pa.s at 25° C.; the organopolysiloxane resin consists essentially of $(CH_3)_2CH_2=CHSiO_{1/2}$ units, $(CH_3)_3SiO_{1/2}$ units, and $SiO_{4/2}$ units; the organohydrogenpolysiloxane comprises a mixture of a trimethylsiloxy-terminated dimethylmethylhydrogensiloxane and (ii) a trimethylsiloxy-terminated polymethylhydrogensiloxane; and the hydrosilylation catalyst is a platinum catalyst.

28. The composition according to claim 22, further comprising an inorganic filler selected from the group consisting of alumina, boron nitride, aluminum nitride, and fused silica.

29. A method of preparing a silicone composition, comprising the step of mixing:
(A) 100 parts by weight of a polydiorganosiloxane containing an average of at least two silicon-bonded alkenyl groups per molecule;

(B) 75 to 150 parts by weight of an organopolysiloxane resin having a number-average molecular weight of from 2,000 to 5,000 and consisting essentially of $R^3_2R^4 SiO_{1/2}$ units and $SiO_{4/2}$ units wherein each $R^3$ is independently selected from the group consisting of monovalent hydrocarbon and monovalent halogenated hydrocarbon groups free of aliphatic unsaturation, $R^4$ is selected from the group consisting of $R^3$ and alkenyl groups, the mole ratio of $R^3_2R^4 SiO_{1/2}$ units to $SiO_{4/2}$ units is from 0.6:1 to 1.1:1, and the resin contains an average of from 2.5 to 7.5 mole percent of alkenyl groups;

(C) an organohydrogenpolysiloxane having an average of at least three silicon-bonded hydrogen atoms per molecule in an amount sufficient to provide from one to three silicon-bonded hydrogen atoms per alkenyl group in components (A) and (B) combined;

(D) an adhesion promoter in an amount sufficient to effect adhesion of the composition to a substrate; and (E) a hydrosilylation catalyst in an amount sufficient to cure the composition.

* * * * *